United States Patent

Colineau et al.

[11] Patent Number: 5,986,834
[45] Date of Patent: Nov. 16, 1999

[54] CLOCK CIRCUIT FOR THE READING OF SEQUENTIALLY RECORDED INFORMATION ELEMENTS IN A MULTITRACK RECORDING SYSTEM

[75] Inventors: Joseph Colineau, Bures Sur Yvette; Michel Audoin, Villeneuve St Georges, both of France

[73] Assignee: Thomson-CSF, Puteaux, France

[21] Appl. No.: 08/478,809

[22] Filed: Jun. 7, 1995

Related U.S. Application Data

[63] Continuation of application No. 07/991,592, Dec. 16, 1992, abandoned.

[30] Foreign Application Priority Data

Dec. 23, 1991 [FR] France .................................. 91 16046

[51] Int. Cl.⁶ .................................................... G11B 5/09
[52] U.S. Cl. ............................. 360/51; 360/26; 375/376; 327/159
[58] Field of Search ............................. 360/51, 114, 121, 360/119; 315/408; 358/60; 369/44, 45, 275; 331/17; 328/155; 375/120, 119

[56] References Cited

U.S. PATENT DOCUMENTS

| | | | |
|---|---|---|---|
| 4,005,266 | 1/1977 | Lehr et al. | 178/69.1 |
| 4,425,533 | 1/1984 | Colineau et al. | 315/408 |
| 4,433,424 | 2/1984 | Taber et al. | 375/354 |
| 4,438,375 | 3/1984 | Colineau et al. | 315/408 |
| 4,470,082 | 9/1984 | Van Pelt et al. | 360/51 |
| 4,535,431 | 8/1985 | Bricot et al. | 369/44 |
| 4,561,082 | 12/1985 | Gerard et al. | 369/45 |
| 4,577,163 | 3/1986 | Culp | 331/1 A |
| 4,621,281 | 11/1986 | Colineau | 358/60 |
| 4,669,077 | 5/1987 | Gerard et al. | 369/275 |
| 4,682,209 | 7/1987 | Nillesen | 348/539 |
| 4,706,115 | 11/1987 | Colineau et al. | 358/60 |
| 4,731,676 | 3/1988 | Berlekamp . | |
| 4,816,908 | 3/1989 | Colineau et al. | 358/60 |
| 5,063,467 | 11/1991 | Colineau et al. | 360/119 |
| 5,142,420 | 8/1992 | Tanaka et al. | 360/32 |
| 5,189,579 | 2/1993 | Colineau | 360/121 |
| 5,227,938 | 7/1993 | Colineau et al. | 360/114 |
| 5,250,913 | 10/1993 | Gleichert et al. | 331/17 X |
| 5,452,326 | 9/1995 | Tanaka | 375/376 |

FOREIGN PATENT DOCUMENTS

| | | |
|---|---|---|
| 239413 | 9/1987 | European Pat. Off. . |
| 274704 | 7/1988 | European Pat. Off. . |
| WO 84/00435 | 2/1984 | WIPO . |

OTHER PUBLICATIONS

Ahonen, IBM Technical Disclosure Bulletin, vol. 21, No. 6, Nov. 1978, p.2246.

Katou, Patent Abstracts of Japan, vol. 9, No. 195, JP60–61959, Apr. 1985. "Clock Synchronizing Circuit of Multi–Track Type Magnetic Recording and Reproducing Device".

*Primary Examiner*—W. Chris Kim
*Assistant Examiner*—Dan I. Davidson
*Attorney, Agent, or Firm*—Oblon, Spivak, McClelland, Maier & Neustadt, P.C.

[57] ABSTRACT

A clock circuit for the reading of sequential information elements includes a phase-locked loop for the control of the controlled oscillator. In the case of a reading system with n tracks, the phase computation circuit, the digital filter and the controlled oscillator each include as many memories (delay circuits R 1.1, ... R 2.1, ... R 3.1, ... ) as there are samples of information elements (or information tracks) to be processed almost simultaneously. The invention finds particular application in the reading of high-density recording media.

17 Claims, 5 Drawing Sheets

CLOCK CIRCUIT FOR THE READING OF SEQUENTIALLY RECORDED INFORMATION ELEMENTS IN A MULTITRACK RECORDING SYSTEM

This application is a Continuation of application Ser. No. 07/991,592, filed on Dec. 16, 1992, now abandoned.

BACKGROUND OF THE INVENTION

The invention relates to a clock circuit for a system for the reading of sequential information elements. It can be applied, for example, to the reading of information elements recorded on magnetic tape, magnetic disks or optical disks, notably in computer peripherals.

In a digital recorder, the decoding of the binary information elements is done by the regeneration of the temporal reference signal (clock signal) used for the recording of the information elements. This clock signal is usually given by a voltage controlled oscillator inserted in a phase-locked loop which is synchronized with the transitions of the reading signal.

In a multitrack recorder, it is possible to use a single clock circuit reconstructed for all the tracks, provided that the synchronization among all the tracks recorded on the tape is preserved. This entails the assumption that the recording heads and the reading heads are aligned and that the tape does not become deformed. If these conditions are not strictly met, the temporal references of the various tracks become offset with respect to each other, undergoing "skew". It is possible to compensate for skew defects if they are not too great.

In the other cases, and especially in recorders which achieve a high density of information in the longitudinal direction of the reading of the recording media, and which have a large number of parallel tracks, it is impossible to keep the skew small enough to be able to compensate for it on all the tracks. It is then necessary to make an independent clock regeneration circuit for each track, and this leads to having a great number of circuits.

The invention is aimed at reducing this great number of clock circuits. According to the invention, the digital structure of the clock regeneration circuit makes it possible, with only one set of operators, to carry out the necessary operations sequentially on a large number of tracks, leading to a major simplification of the electronics. The invention takes advantage of the correlations that exist among the clock signals of each of the tracks.

This sequential circuit according to the invention enables substantial improvement in the performance characteristics of the entire system.

SUMMARY OF THE INVENTION

An object of the invention is a clock circuit for a sequential information reading system for the reading of several series of information elements recorded substantially in a same period, on several recording means and necessitating, for the reading, a determined sampling period, wherein said circuit comprises:

a phase computation circuit receiving the information elements and computing the phase of each signal from the reading of two successive samples of a same series of information elements and outputting a computed phase signal, the circuit being capable of being connected selectively to different recording means;

a phase comparison circuit receiving each computed phase signal and comparing it with an oscillator signal and outputting an error signal;

a digital filter receiving the phase error signal, filtering it and outputting an oscillator control signal; and a digital oscillator having its frequency and phase controlled by the oscillator control signal and outputting an oscillator signal, this digital oscillator comprising one memory element per series of information elements to which the phase computation circuit can be connected.

BRIEF DESCRIPTION OF THE DRAWINGS

The various objects and characteristics of the invention will appear more clearly from the following description, given by way of an example and from the appended figures of which.

DETAILED DESCRIPTION OF THE INVENTION

Figure 2:
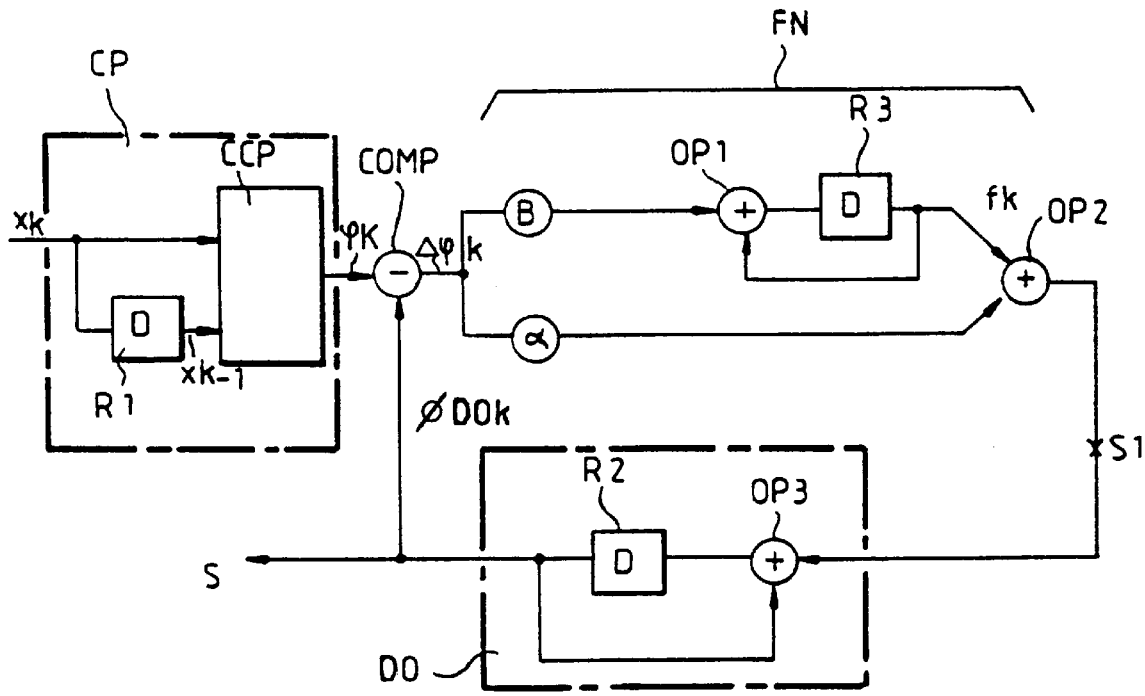
FIG. 2 shows a detailed exemplary embodiment of a phase following and synchronizing circuit of the kind used in the invention.

The circuit of FIG. 2 has a reading input $x_k$ at which the digital information elements of a recorded track arrive sequentially. For example, this track may be a track of a recording tape.

A phase computation circuit CP for the computation of the phase of the signal receives information elements, and computes the phase of the signal from the values of two successive signals when they have opposite signs. To this end, a circuit R1 memorizes an information element and phase difference computation means CCP computes the phase difference between the instant of detection of a signal and the instant of detection of a following signal.

A phase lock loop comprising a phase comparison circuit COMP compares the phase between the computed phase of the signal and that of a digital oscillator referenced DO.

A digital filter FN filters the phase error signal and prepares a signal for the digital control of the oscillator.

At the output S, the digital oscillator DO delivers a signal, the frequency and the phase of which are controlled by the filtered signal of the digital filter FN. The circuits OP1, OP2, OP3 are adder operators. The role of the circuit of FIG. 2 is to prepare, for each new signal sample $x_k$, an estimation of the phase of this sample, the phase reference being the bit clock signal $\phi_{DO}k$, namely the theoretical instants of transition. When there is a transition of the signal, the phase computation circuit may deliver a measured value of the phase of the signal and, after filtering, this new value is used to update the phase estimation.

The algorithm proposed to adjust the optimum instant of transition or to follow the phase of the signal to be demodulated (in the receiver) is known. It is based on the following equations:

$$\begin{cases} \phi_{DO}(k+1) = (\phi_{DO}(k) + \alpha\Delta\phi(k) + 2\pi Tef(k))_{2\pi} \\ f(k+1) = f(k) + \dfrac{\beta\Delta\phi(k)}{2\pi Te} \\ \Delta\phi(k) = (\phi_{signal}(k) - \phi_{DO}(k))_{2\pi} \end{cases}$$

with Te: fixed sampling period for the system.

If the frequency and the phase are standardized, this system of equations can be written more simply:

$$\begin{cases} \phi_{DO}(k+1) = (\phi_{DO}(k) + \alpha\Delta\phi(k) + f(k))_1 \\ f(k+1) = f(k) + \beta\Delta\phi(k) \\ \Delta\phi(k) = (\phi_{signal}(k) - \phi_{DO}(k))_1 \end{cases}$$

The future phase of the signal is predicted as a function of the present phase of the oscillator, its clock period and a phase error that is weighted between the input signal and the oscillator. The correction of the phase error is applied only when a measurement of the phase of the signal is available. Otherwise, the phase of the oscillator is maintained to within plus or minus one period.

Figure 1A:
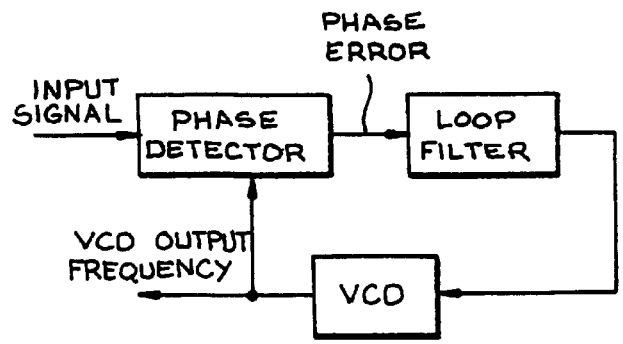
FIG. 1a shows a schematic diagram of an analog phase locked loop.
Figure 1B:
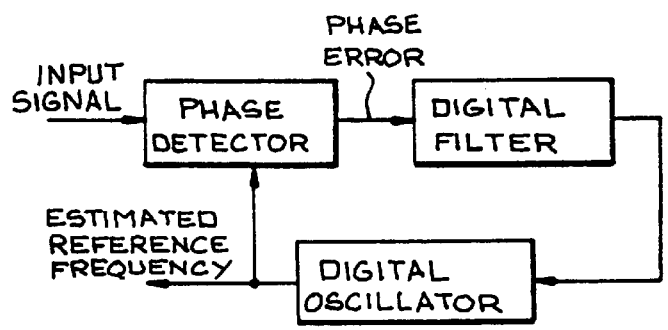
FIG. 1b shows a schematic diagram of a digital phase locked loop.

These equations describe the working of a second-order phase locked loop constituted by a digital oscillator DO outputting a signal with a frequency f(k) and a phase $\phi_{DO}(k)$ between the signal of the digital oscillator and a reference signal (referenced $F_{signal}$ or $F_S$).

α and β are weighting coefficients that adjust the weight of the last measurement made and are called loop parameters. The block diagrams of analog and digital phase locked loops are presented in FIGS. 1a and 1b.

In FIG. 2, the different circuits comprise delay circuits R1, R2, R3 which have a delay time that is the sampling period D of the signal to be read. According to this exemplary embodiment, since the recording medium is a magnetic tape, there is one circuit such as the circuit of FIG. 2 per recording track.

The phase of the signal is computed from the value of two successive samples when there is a change in sign between these two samples. The computation is done from a ROM according to the "look-up table" technique.

In a multitrack system, n tracks are read simultaneously. Depending on the embodiment and implementation of the reading system, n samples corresponding to n tracks are available simultaneously at each sampling instant, or are delivered simultaneously for the duration of the sampling period.

The circuit of FIG. 2 is applicable to a multitrack system or more generally to a system with n independent tracks. To this end, this circuit will be made to work successively on the samples of data corresponding to each of the n tracks, in their order of arrival. In order to carry out all the operations described by the algorithm for the track i at the i+kn instants, the values that need to be kept in the memory must be presented, at these instants, at the input of the operators, these variables being $(x_k, \Phi_k, f_k)$.

Figure 3:
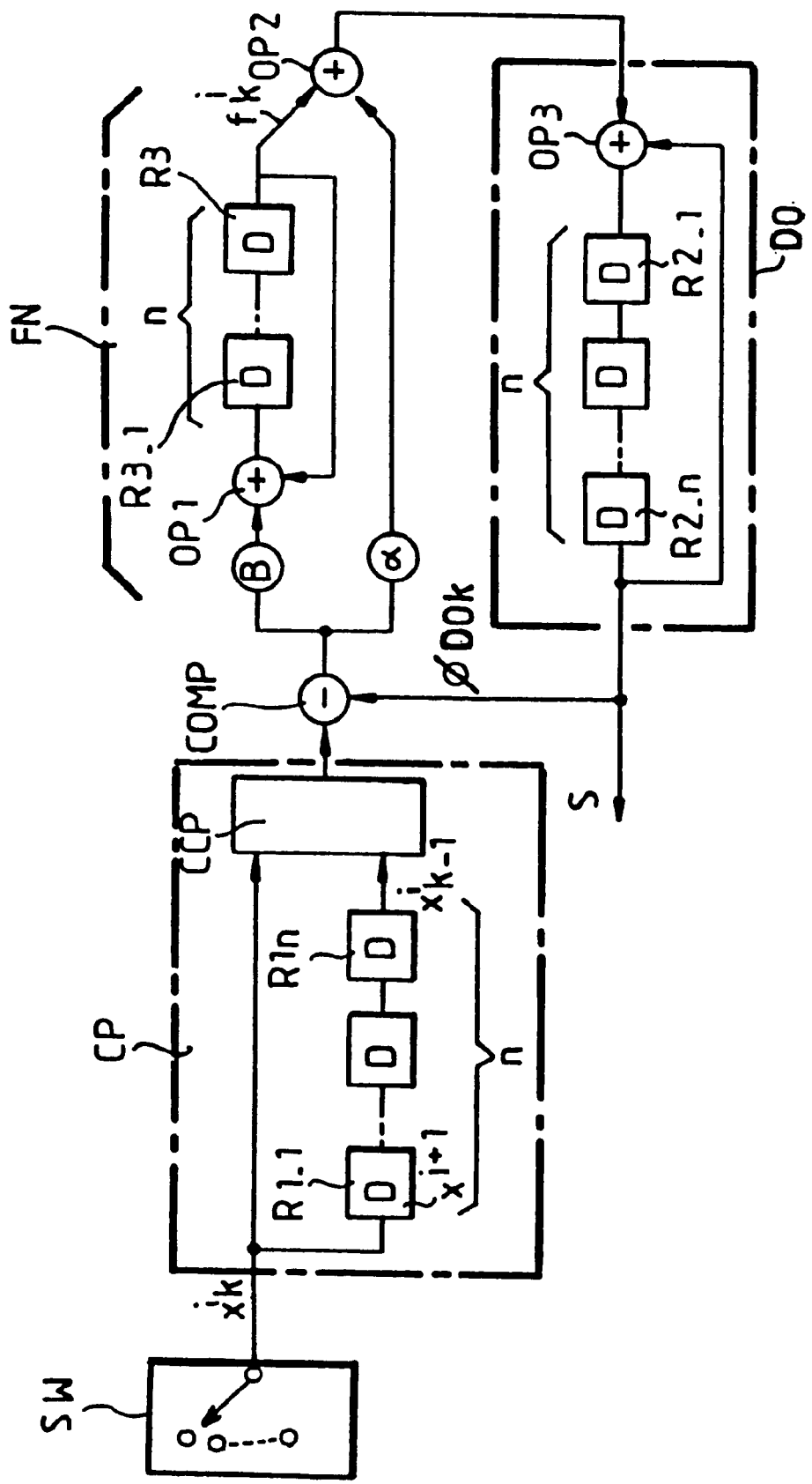
FIGS. 3, 4 and 6 show exemplary embodiments of the circuit of the invention.

FIG. 3 shows an exemplary embodiment in which the recording medium shows several tracks of information elements in parallel.

Instead of providing for one clock circuit per track, there is provision for one clock circuit for a number n of tracks.

In this case, each delay circuit R1, R2, R3 is actually a set of n delay circuits (corresponding to the number n of tracks). Indeed, the n tracks are read simultaneously, and what has to be done is to assign a clock signal to each track. More specifically, the phase computation circuit CP is connected selectively by switching means SW to the input circuit $x_k$.

The delay circuits constitute shift registers with a length n, or circular buffers made out of RAMs, which can be used to preserve the intermediate results of each of the n tracks to be processed. At the instant i+kn, the values $\phi_k^i, f_k^i, x_k^i, x_{k-1}^i$ corresponding to the track i are presented to the inputs of the operators and enable the estimation of $\phi_{k+1}^i$ and $f_{k+1}^i$. One instant later, the track i+1 is processed. After n clock strokes, the track i is processed again.

The previously described phase loop is a second-order loop since it estimates two parameters of the signal (frequency and phase). The estimation of the frequency becomes a delicate task because of the great precision required. In view of the low signal-to-noise ratio that is found typically in a high density recorder, the coefficient β is small (typically 5 $10^{-3}$), which leads to computations on 16 or 24 bits. This also entails a lengthy and delicate synchronization stage (a transient period when the process is started). For these reasons, many of the clock circuits used in recording are simply first-order filters.

If the frequency of the signal is considered to be proportional to the speed of the tape, and if the heads are aligned, then the instantaneous frequency is substantially the same on each of the tracks. It is then possible to substantially improve the estimation of the frequency on a track by replacing it by the average of the estimations made on all the tracks. Thus, if the average is taken of the results of n independent tracks, the signal-to-noise ratio could be improved by $\sqrt{n}$.

Figure 4:
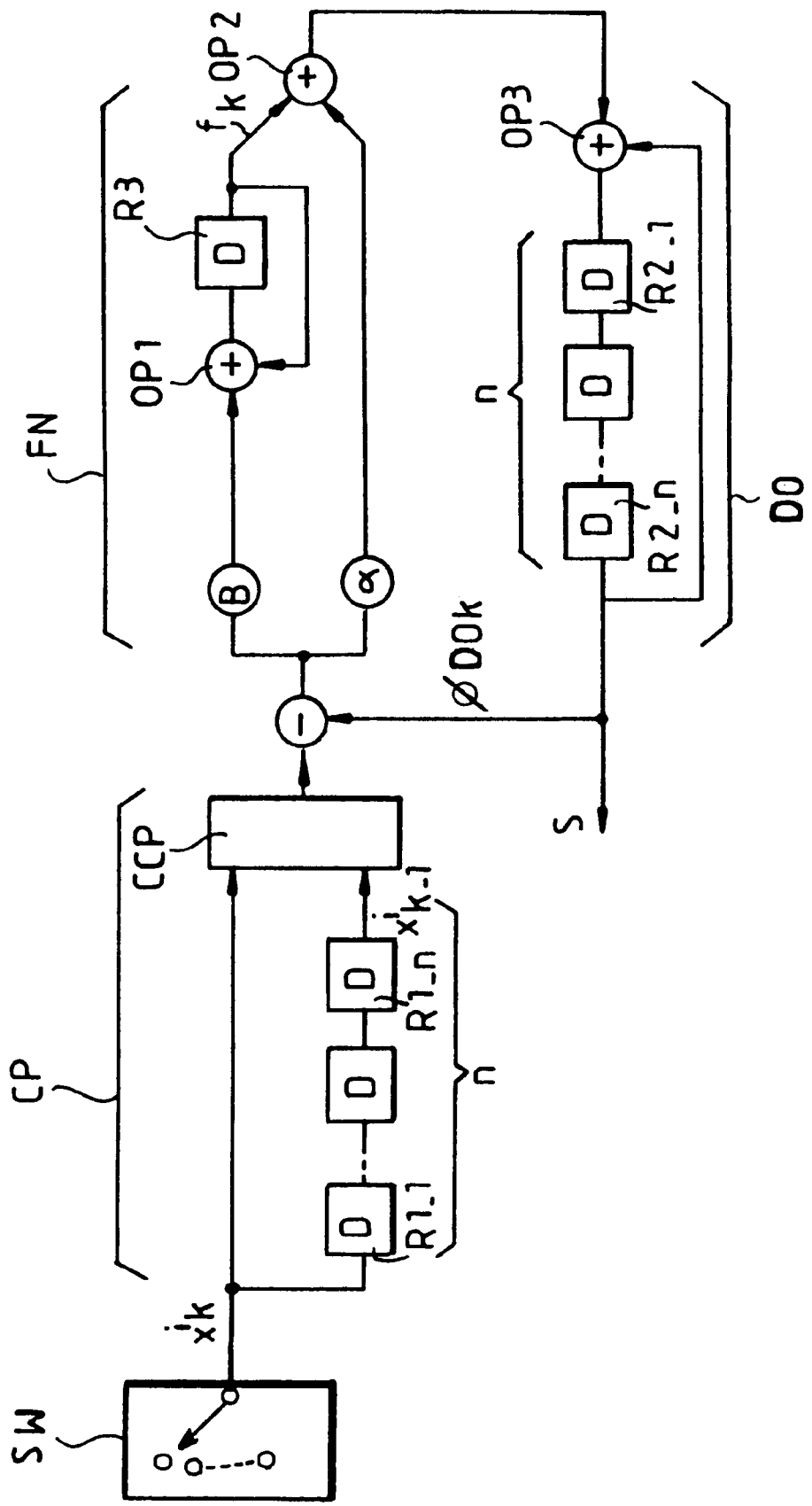

As can be seen in FIG. 4, the circuit is modified so that one and the same memory register R3 is used to store the frequency of each of the n tracks, thus obtaining an average of the n individual estimations of the frequency.

This approach has the following advantages:

the frequency is estimated with greater precision, which leads to an increase in the gain and/or the passband of the loop;

the synchronization phase is faster, and the holding of the synchronization when there is a momentary absence of the signal on a track is improved, since all the tracks contribute to the estimation. The probability of all the tracks being faulty is very low;

it is possible to make the system fail-safe by dedicating a track to the control of the speed, by the recording on this track of a signal with a fixed frequency or of a clock-intensive code (for example FM or two-phase) which will furthermore be used as a control track (for the recording of a time-code or other service signals);

it becomes possible to use maximum run-length codes: for example scrambled "no-zero-set" codes, or to use narrow temporal window codes, for example the run limited length (RLL) codes of the (d,k) (1,x) type.

Figures 5A, 5B:
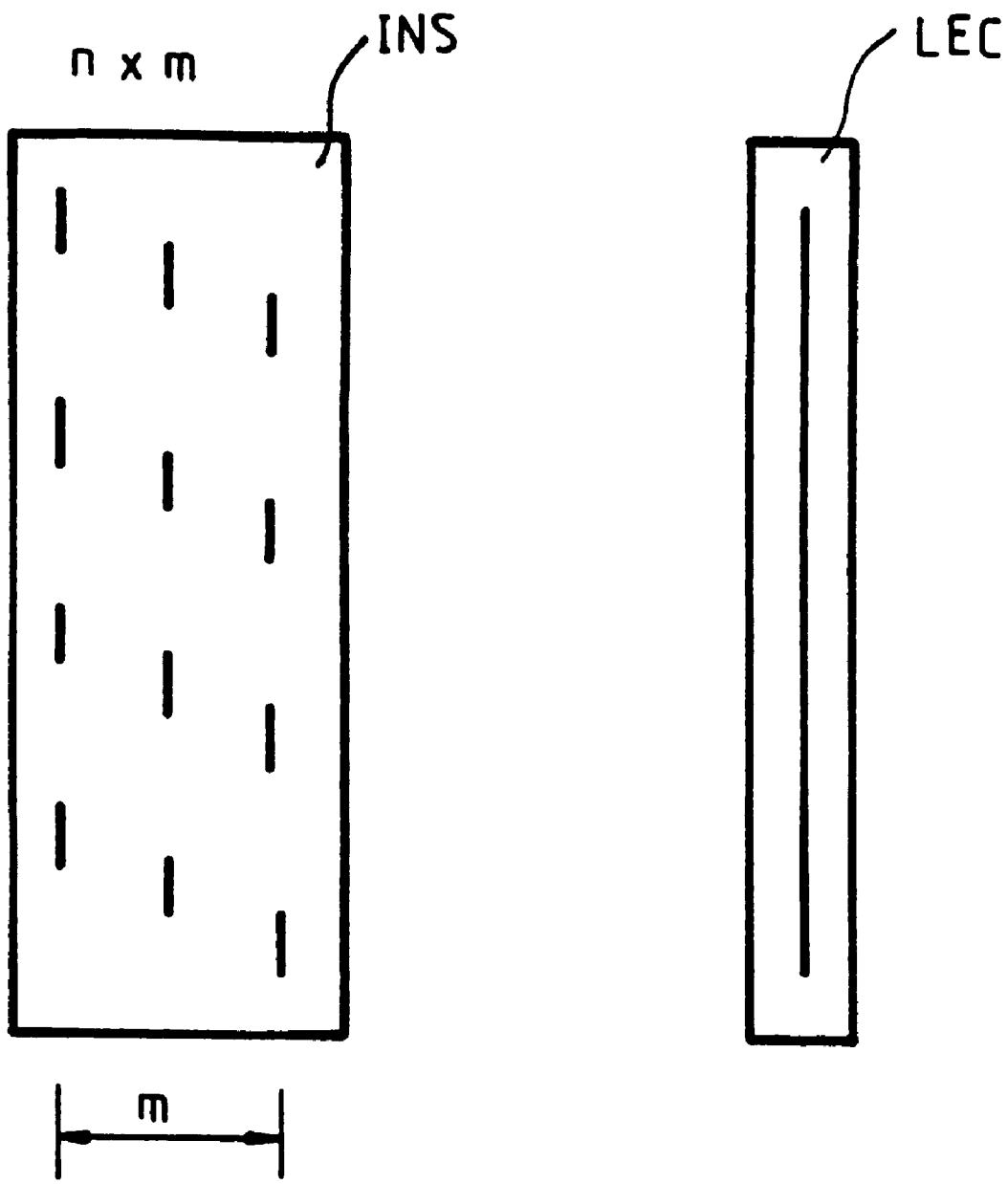
FIG. 5 shows an organization of a head used for reading and recording on a recording tape.

FIG. 5 shows an example of a recorder with static heads where the two heads do not have the same geometry: here, the writing head INS has a "matrix" geometry, i.e. the gaps are arranged in m lines of n heads while the reading head LEC has all of its gaps arranged linewise. It is not possible then to assume that the instantaneous frequency of the signal is the same only for the tracks for which the writing heads belong to the same vertical line. In this case, therefore, it is necessary to make m estimations of the frequency, for the m groups of n heads. This is obtained by means of a shift register with m states. Naturally, this method can be applied when the reading head also has a matrix structure.

Figure 6:
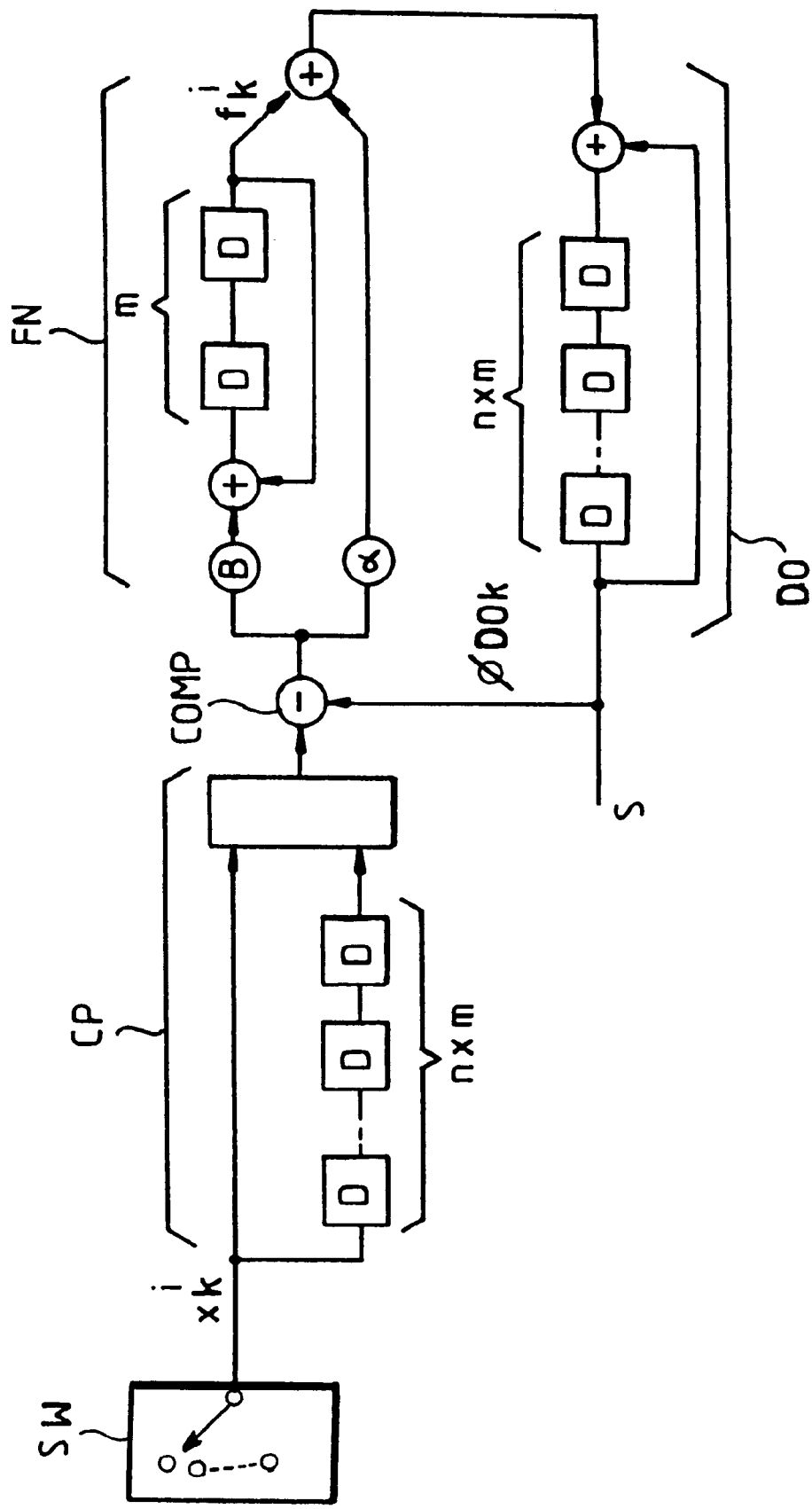

The circuit of FIG. 6 is very similar to that of FIG. 4 and operates substantially in accordance with the description relating thereto, with the exceptions that the phase computation circuit CP comprises n×m delay circuits, the digital filter FN comprises m delay circuits, and the digital oscillator VCO comprises n×m delay circuits. The circuit of FIG. 6 is thus fully operational as a recording system described in relation to FIG. 5, which illustrates m groups of n writing heads resulting in n×m recording tracks.

The approach described herein, wherein the frequency estimations are pooled only when they are close to one other, extends to the case where, owing to the large number of tracks and the high recording density, it is no longer possible to consider the frequency of the signal to be strictly the same from one edge of the tape to the other. In this case, the tracks will be separated into groups wherein neighboring tracks have similar characteristics, and as many memory compartments will be used as there are groups to be processed distinctly.

This structure can be used in a good number of digital channels, when parameters to be estimated are common to the various channels.

The above description has been given purely by way of an example of an application to the reading of information on tape. However, the circuit of the invention can be used in any other type of application for the reading of sequential information elements (notably digital information elements).

These types of applications will preferably entail having to read information elements for which certain parameters to be estimated are common to the different channels. Furthermore, the exemplary embodiments are given purely to illustrate the description, and other variants may be contemplated without going beyond the scope of the invention. In particular, in the figures described, delay circuits have been used but memories could have been used.

Again, for the input of the phase computation circuit, it is of little importance whether the samples of signals $x_k$ come directly (and sequentially) from the recording medium or whether they come from intermediate memories where they have been recorded simultaneously.

What is claimed is:

1. A clock circuit for the reading of information elements sequentially recorded on a recording medium in a digital multi-track recording system, said clock circuit comprising:

phase computation means for receiving information elements sequentially recorded on at least one recording track of a recording medium and for computing a phase of each signal recorded on each one of said at least one recording track upon receipt of two successively recorded information elements of each signal during successive sampling periods and outputting a computed phase signal for each signal recorded on each one of said at least one recording track;

means for connecting an input of said phase computation circuit to receive signals recorded on recording tracks of said recording medium;

phase comparison means for receiving said computed phase signal corresponding to each signal recorded on each one of said at least one recording track and for comparing a phase of said computed phase signal to a phase of a locally generated signal and outputting a phase error signal corresponding to each signal recorded on each one of said at least one recording track;

digital filter means for receiving said phase error signal corresponding to each signal recorded on each one of said at least one recording track and outputting an oscillator control signal; and a digital oscillator for receiving said oscillator control signal and outputting said locally generated signal, a frequency and a phase of which are controlled by said oscillator control signal, said digital oscillator comprising one memory element per recording track.

2. A clock circuit according to claim 1, the phase computation means comprising m×n memory elements and the digital oscillator comprising m×n memory elements wherein m is the number of n series of information elements recorded on said recording medium.

3. A clock circuit according to claim 2, wherein the digital filter means comprises m×n memory elements.

4. A clock circuit according to claim 2, wherein the digital filter means comprises m memory elements.

5. A clock circuit according to claim 1, further comprising switching means for selectively connecting said input of said phase computation means to receive outputs of a plurality of recording tracks of said recording medium, a period of switching of said switching means being selected such that a time period between two successive connections of said input of said phase computation circuit to a determined recording track is substantially equal to a multiple of a sampling period of said determined recording track.

6. A clock circuit according to claim 5, wherein said phase computation means comprises one computed phase signal memory element per recording track.

7. A clock circuit according to claim 5, wherein said phase computation means comprises one memory element per recording track therefor.

8. A clock circuit according to any of claims 2 or 7, wherein said digital filter means comprises exactly one memory element.

9. A clock circuit according to claim 1, wherein each one of said one memory element per recorded track comprises at least one delay circuit.

10. A clock circuit according to claim 9 wherein, in said phase computation means in said digital filter means, and in said digital oscillator, a combination of memory elements is achieved by a series connection of delay circuits.

11. A clock circuit according to claim 10, wherein each delay circuit determines a delay time corresponding to a switching time separating the connection of the phase computation means to two consecutive recording tracks.

12. A clock circuit according to claim 11, wherein the digital oscillator comprises a delay loop, the delay time of which corresponds to the period of sampling of the recording medium.

13. A clock circuit according to claim 11, wherein the phase computation means comprises a delay circuit, the delay time of which corresponds to the period of sampling of the recording medium.

14. A clock circuit according to claim 11, wherein the digital filter means comprises at least one delay circuit, the delay time of which corresponds to the period of sampling of the recording medium.

15. A clock circuit according to any of claims 12 to 14, wherein each delay loop comprises n delay circuits, the sums of the delays of the circuits of one delay loop being equal to a sampling period of the recording medium.

16. A clock circuit according to claim 15, further comprising a single clock circuit common to the different series of information elements; the phase computation means and the digital oscillator each comprising a number of delay circuits equal to the number of series of information element multiplied by the number of information elements contained in a series, the total duration of the delay of each of these sets of delay circuits being equal to the period of sampling of the information elements to be rad; and digital filter means comprising a number of delay circuits equal to the number of information elements contained in a series.

17. A clock circuit according to any of claims 12 to 14, wherein the digital filter means comprises a delay circuit corresponding to a period of sampling of the recording medium; and the digital oscillator and the phase computation means each comprise n delay circuits, the sum of the delays of said n delay circuits corresponds to the period of sampling of the recording medium.

\* \* \* \* \*